United States Patent [19]
Kadono

[11] Patent Number: 4,881,206
[45] Date of Patent: Nov. 14, 1989

[54] MEMORY DEVICE
[75] Inventor: Takashi Kadono, Osaka, Japan
[73] Assignee: Minolta Camera Kabushiki Kaisha, Osaka, Japan
[21] Appl. No.: 137,234
[22] Filed: Dec. 22, 1987
[30] Foreign Application Priority Data
  Dec. 26, 1986 [JP] Japan .................. 61-314268
[51] Int. Cl.[4] .............................................. G11C 13/00
[52] U.S. Cl. ................................ 365/227; 365/189.04; 365/218; 365/193
[58] Field of Search ............... 365/189, 230, 218, 193, 365/194, 195, 227, 189.04, 230.09
[56] References Cited
  U.S. PATENT DOCUMENTS
  4,716,544 12/1987 Bartley .................................. 364/900
  4,813,021 3/1989 Kai et al. ............................. 365/194

OTHER PUBLICATIONS
"1-Mbit Dram controller shuns complex timing and protocol to streamline high speed systems" by Z. Amitai, May 1, 1986, Electronic Design.

Primary Examiner—Terrell W. Fears
Attorney, Agent, or Firm—Price, Gess & Ubell

[57] ABSTRACT

The memory device of this invention comprises a plurality of banks to which common address/data lines are connected, bank-selecting means for selectively feeding data read/write control signals to each bank, and a plurality of circuits for simultaneously feeding control signals to all banks, so that above constitution allows the memory device to simultaneously feed control signals to all the banks when erasing the entire memory content, thus making it possible for the memory device to effectively erase the entire memory content at an extremely high speed.

16 Claims, 4 Drawing Sheets

MEMORY DEVICE

BACKGROUND OF THE INVENTION

1. Field of the Invention

The present invention relates to a memory device, and more particularly, to a memory device which is capable of quickly erasing the entire content of a large-capacity memory like a bit-map format picture memory for example.

2. Description of the Prior Art

Conventionally, bit-map format picture memories are widely made available for processing graphic picture signals or controlling the character-writing position.

Generally, these conventional bit-map format picture memories are provided with a substantial capacity because of the need for providing siubstantial memory area that is enough to accommodate a page-full dot data of picture information.

Typically, as shown in FIG. 1, these conventional picture memories are provided with 1M byte memory capacity by applying 4 units of banks 1 through 4, each being comprised of a plurality of 256k-bit dynamic RAMs for example, in which banks 1 through 4 are respectively in connection with commonly-available address lines A0 through A8 and data lines DO0 and DO7 and DI0 through DI7. In addition, these banks 1 through 4 are also connected to the control-signal transmission line via a bank-selecting means 5.

FIG. 2 is the circuit diagram of a conventional bank-selecting means 5. Decoder 6 decodes the upper bits A18 and A19 of address signals to selectively allow one of NAND gates 15 through 18 to open itself so that the control signals comprised of RAS (Row Address Strobe) signal, CAS (Column Address Strobe) signal, and WE (Write Enable) signal can selectively be delivered to whichever of those banks 1 through 4.

When either the power of the picture memory is on or a new picture data is written into it, the content of old data in memory should be erased.

The picture memory content is erased by writing memory area. When erasing the data content stored in the picture memory by applying conventional bank-selecting means shown in FIG. 2, the designated data are written into the picture memory by each byte by sequentially designating addresses. After completing the writing of needed data into picture memory bank 1, the data are sequentially written into banks 2 through 4, thus eventually requiring the conventional memory system to spend much time before fully erasing the data content stored in these picture-memory banks 1 through 4.

As shown in FIG. 1, any of those large-capacity picture memories is mostly comprised of a dynamic RAM. However, in order to access the dynamic RAM within the shortest period of time, access operation requires delicate coordination with the refreshing cycles of the dynamic RAM itself. Since erasure of the memory content lasts for a long period of time, extreme complexity is needed for designing the access timing.

In particular, reflecting such an extremely large capacity of the picture memory, the saving of time to be spent for erasure of memory content is a critical problem in dealing with any picture-processing apparatus featuring high resolution like a laser printer for example.

SUMMARY OF THE INVENTION

A first object of this invention is to overcome those problems mentioned above by providing a novel memory device which is capable of fully erasing the content of a large-capacity memory like a bit-map format picture memory at an extremely fast speed.

A second object of this invention is to provide a novel memory device which effectively constrains the consumption of power needed for erasing the content of a large-capacity memory.

The memory device of this invention having a plurality of bank memories to which common address lines and common data lines are respectively connected, and bank-selecting means having a plurality of first circuits connected to respective bank memories, each first circuit providing the corresponding bank memory with control signals needed for writing data into the corresponding bank memory or reading data from the same on receipt of bank-selecting signals designating the same, comprises a plurality of second circuits connected to said first circuit respectively for delivering a signal substantially equivalent to said bank-selecting signal to all of said first circuit so as to simultaneously deliver said control signals to all of said bank memories.

The above and further objects and features of the invention will more fully be apparent from the following detailed description with accompanying drawings.

DESCRIPTION OF THE PREFERRED EMBODIMENTS

Referring now more particularly to the appended drawings, a preferred embodiment of the memory device relating to the present invention is described below.

Figure 1:
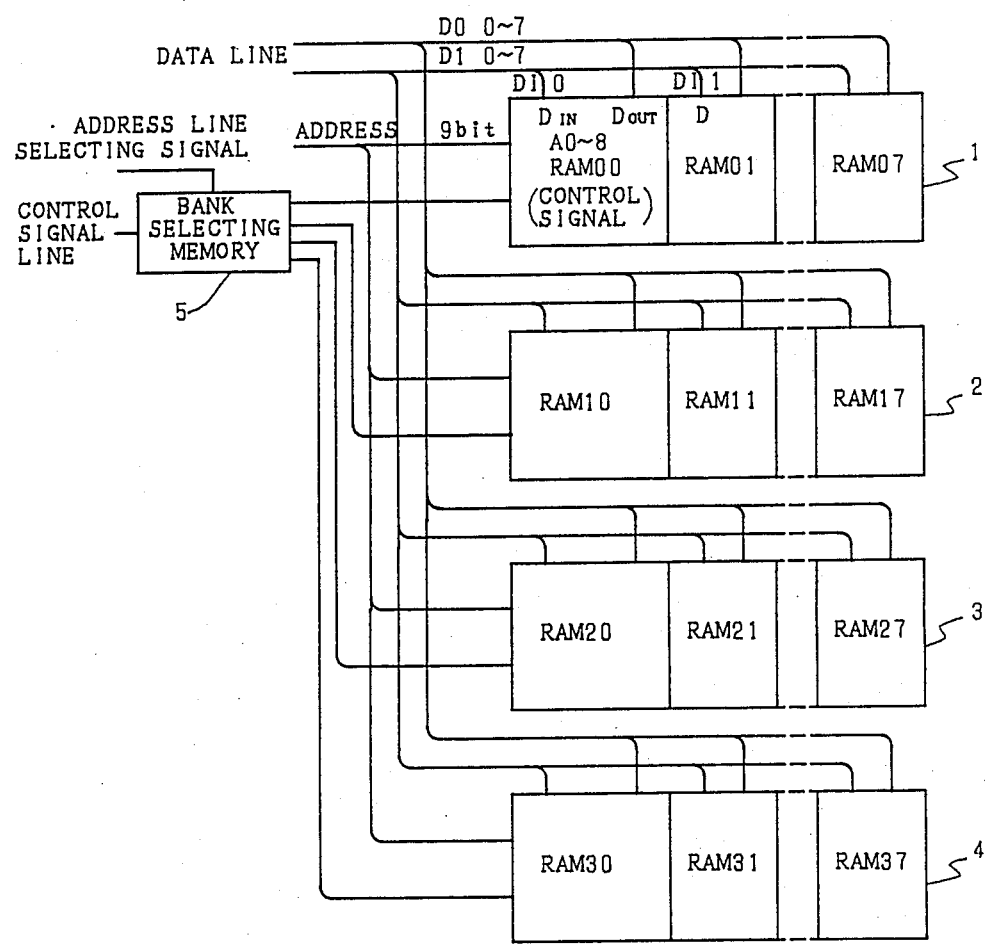
FIG. 1 is a simplified block diagram denoting the entire constitution of a conventional memory device.

FIG. 1 is a simplified block diagram denoting the entire constitution of a conventional memory device. This memory device is provided with 4 units of banks 1 through 4, each being comprised of 8 chips of 256K-bit dynamic RAMs. Each of these banks 1 through 4 is connected to the commonly-available address lines A0 through A9 and data lines DO0 through DO7 and DI0 through DI7, respectively. Furthermore, each of these banks 1 through 4 is also connected to a control-signal transmitting line via a bank-selecting means, for transmitting control signals needed for writing and reading data into and from bank memories 1 through 4.

Figure 2:
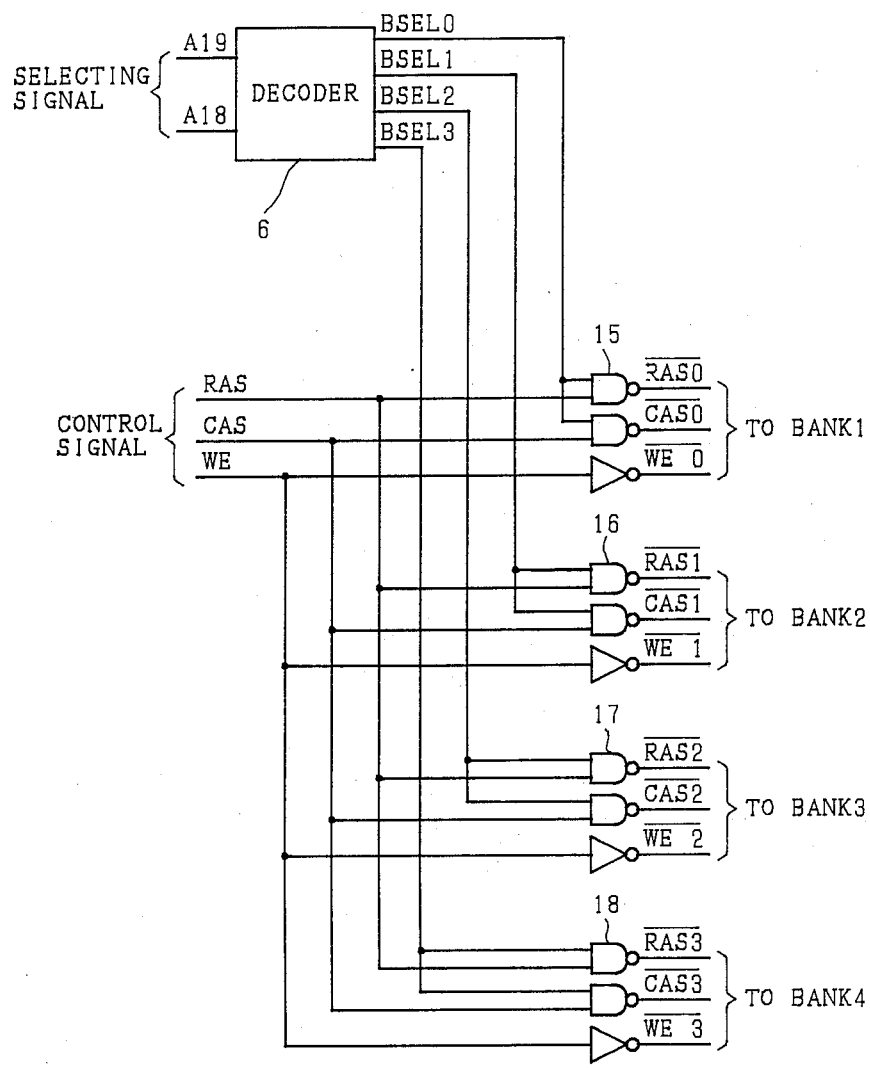
FIG. 2. is a schematic block diagram denoting a logical operation circuit of a conventional bank-selecting means.
Figure 3:
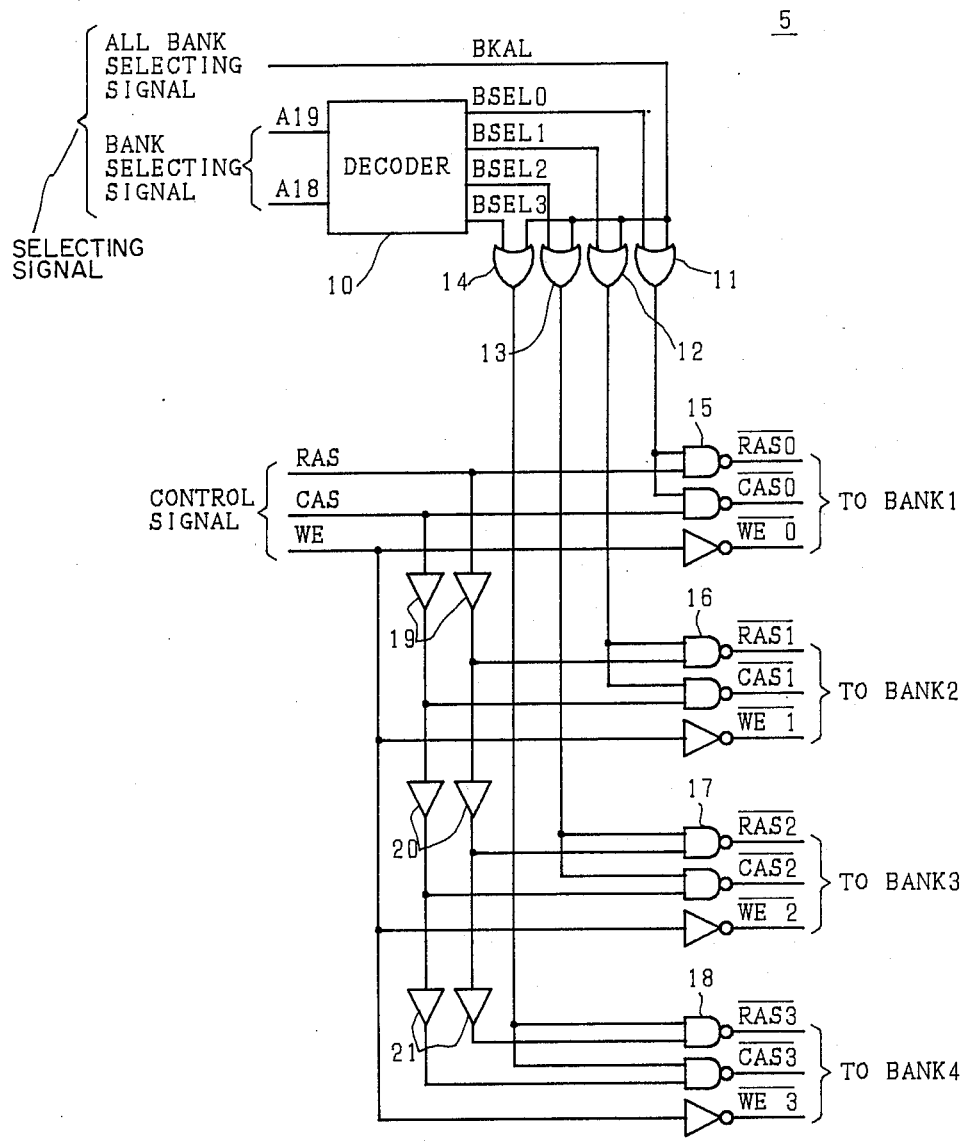
FIG. 3 is a schematic block diagram denoting the logical operation circuit of bank-selecting means of the memory device related to the present invention.

As shown in FIGS. 2 and 3, a bank-selecting signal is comprised of BSEL0 through BSEL3 which are respectively generated by decoding the upper bits A18 and A19 of an address signal for selecting one of the bank memories 1 through 4 and as all-bank-selecting signal BKAL for simultaneously selecting all the bank memories 1 through 4, respectively. The upper bits A18 and A19 are respectively decoded into the bank-selecting signals BSEL0 through BSEL3 by decoder 10, and then, each of these decoded signals is delivered to NAND gates 15 through 18 via OR gates 11 through 14. The all-bank-selecting signal BKAL is connected to OR gates 11 through 14. The bank-selecting signal activates one of OR gates 11 through 14, whereas the all-bank-selecting signal BKAL activates all the OR gates 11 through 14. The control signal needed for writing and reading data into and out of the picture memory is substantially comprised of an RAS signal, a CAS signal, and a WE signal. These component signals are respectively delivered to NAND gates 15 through 18. Of these, RAS and CAS signals are respectively given to delay elements 19 through 21 which are respectively comprised of a Schmitt circuit being interposed on lines connected to NAND gates 16 through 18. When the activated all-bank-selecting signal BKAL simultaneously erases old data and writes new data into bank memories 1 through 4 while simultaneously refreshing those data stored in dynamic RAMs, delay elements 19 through 21 respectively prevent the control signal of all the components from simultaneously being delivered to bank memories 1 through 4, thus effectively constraining the consumption of a large amount of power current otherwise occurring when the control signal of all the components are simultaneously delivered.

FIG. 3 denotes the case in which signals RAS and CAS of the control signal are respectively selected by OR gates 11 through 14. In addition, it is also possible for the memory device of the present invention to choose the designated bank memory by activating only the CAS signal, while delivering the RAS signal to all the bank memories commonly. When the RAS signal is selectively delivered, since only the objective accessible bank memory consumes power, selective delivery of RAS signal provides advantages for such a system dealing with a large-capacity memory like the picture memory.

Figure 4:
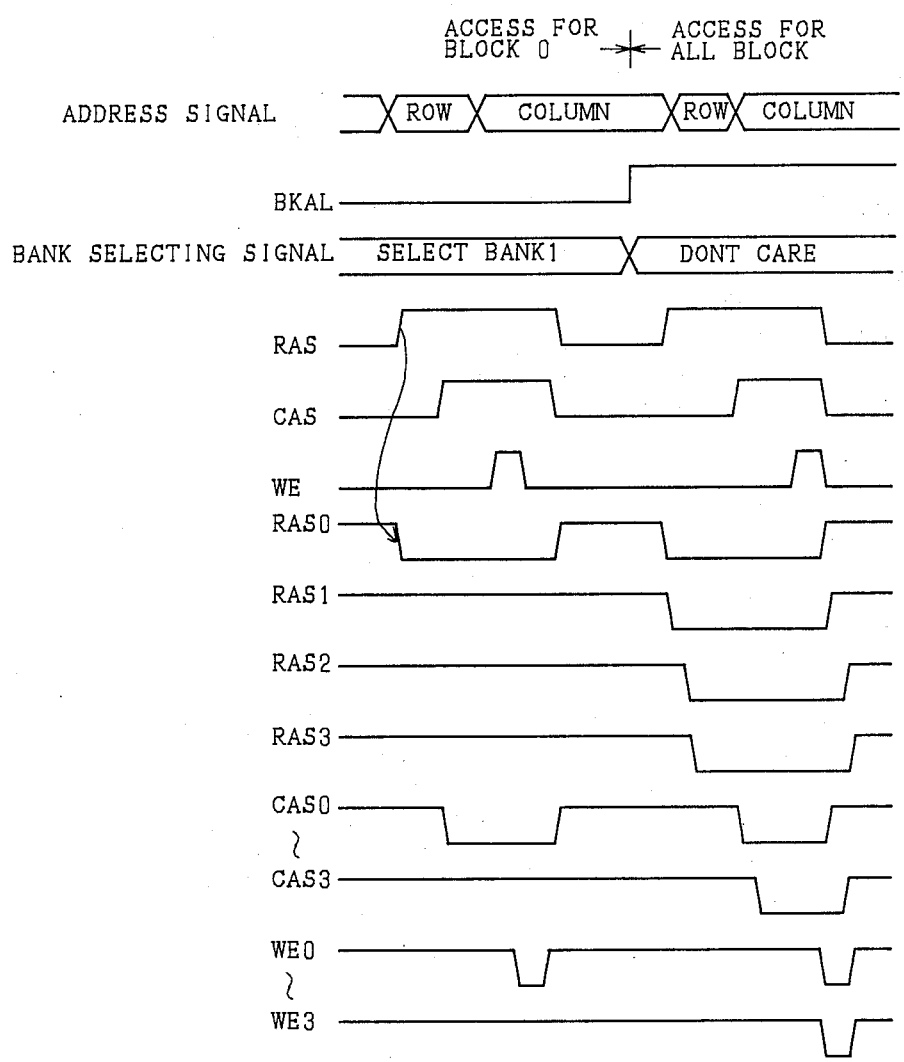
FIG. 4 is a timing chart used for explaining the functional operation of bank-selecting means of the memory device relating to the present invention.

Referring now to the timing chart shown in FIG. 4, a functional operation of a preferred embodiment of the memory device relating to the present invention is described below.

When executing normal writing and reading of data into and from the picture memory, an address of the objective byte is designated from bank memories 1 through 4 by those functional signals such as the addressing signal, the bank-selecting signal, and the signals RAS and CAS, respectively. This allows the designated data to be input or output via the data lines.

When erasing the content of the picture memory, first, the all-bank-selecting signal BKAL outputted from the CPU (not shown) is activated, and then, signals RAS, CAS, and WE of the control signal are respectively activated at adequate intervals so that those data such as OOH or FFH for example can be written into the picture memory from the data lines DI0 through DI7. While these processes are underway, NAND gates 15 through 18 are respectively held open by the all-bank-selecting BKAL to allow signals RAS, CAS, and WE of the control signal to be delivered to bank memories 1 through 4 simultaneously, thus allowing those data corresponding to an amount of 4-byte to be written into the picture memory simultaneously. Since delay elements 19 through 21 sequentially delay the timing for the arrival of signals RAS, CAS, and WE of the control signal at bank memories 1 through 4, this effectively prevents a large amount of current from momentarily flowing through the signal transmission lines, thus securely lowering the peak value of current being consumed in conjunction with the transmission of those functional signals.

The above-cited preferred embodiment of the memory device relating to the present invention securely erases the content of all the picture memories by the data amount of 4 bytes instead of erasing the data amount of 1-byte normally having been dealt by conventional memory devices. Consequently, the memory device embodied by the invention securely erases the content of the entire picture memory at an extremely fast speed, thus drastically saving time needed for fully erasing useless data stored in memory.

Normally, a conventional memory device is obliged to refresh the content of dynamic RAMS while continuously erasing the stored data. Conversely, since the memory device of the present invention almost simultaneously transmits the control signals to all the bank memories 1 through 4, the refreshing of dynamic RAMs is not required at all. Furthermore, since delay elements 19 through 21 sequentially delay the timing for the delivery of signals RAS, CAS, and WE of the control signal to bank memories 1 through 4, the peak value of current can securely be lowered.

The preferred embodiment of the memory device relating to the present invention also introduces a variety of gate circuits other than those OR gate circuits shown in FIG. 2 in order to allow the control signals to be properly delivered to all the bank memories 1 through 4 by activating the all-bank-selecting signal BKAL. Although each of these bank memories 1 through 4 is comprised of 8 bits using 8 memory chips, each of these elements may also be comprised of 12 bits or 16 bits, or other than these. Likewise, the memory device relating to the present invention may also introduce a certain number of bank memories other than 4. Even if the picture memory of the memory device relating to the present invention is merely provided with a modest capacity and thus the delay elements 19 through 21 are omitted, the peak value of current does not rise significantly. The memory device relating to the present invention may also introduce static RAMs in place of dynamic RAMs. The memory device embodied by the present invention is also applicable to any memory system in addition to the picture memory cited for example. According to the kind of memory, the constituents of the control signal are also variable.

As is clear from the foregoing description, since the memory device relating to the present invention securely erases the content of memories at an extremely fast speed, time needed for fuly erasing the entire memory content is drastically minimized. Accordingly, by effectively applying the memory device embodied by the present invention to large capacity memories like the bit-map format picture memories for example, the entire memory content can fully be erased at an extremely fast speed. Furthermore, since those control signals comprised of signals RAS, CAS, and WE are almost simultaneously delivered to a plurality of bank memories, the timing for adequately refreshing the content of dynamic RAMs can easily be controlled.

Since the present invention may be embodied in various forms without departing from the spirit of the essential constituents, those preferred embodiments cited above are thus merely illustrative and not restrictive inasmuch as the scope of the invention is defined by the following claims rather than by the preceding description, and all such modifications and changes falling under the spirit and scope of the claims or the equivalent are thus intended to be included in the following claims.

What is claimed is:

1. A memory device having a plurality of bank memories, comprising:
   first circuit means for delivering a plurality of control signals to said bank memories and for delaying said delivery of control signals to lower a power consumption during operation of said memory device, said control signals for reading data and writing data from and into said bank memories, wherein said first circuit means includes a plurality of NAND gates, and
   second circuit means for selecting one of said bank memories or all of said bank memories for input of signals.

2. The memory device occurring according to claim 1 wherein said first circuit means includes a plurality of NAND gates.

3. The memory device according to claim 1 wherein said second circuit means includes a plurality of OR gates.

4. The memory device according to claim 3 wherein an all bank selecting signal is generated to activate each of said OR gates, and a bank selecting signal is generated to activate a selection OR gate.

5. The memory device according to claim 4 wherein said OR gates can deliver one of a bank selecting signal and said all bank selecting signal to said NAND gates which also receive said control signals.

6. A memory device for simultaneously sending read and write signals to a plurality of bank memories and for erasing data in an amount in excess of one byte, comprising:
   a plurality of NAND gates for receiving a plurality of control signals, said control signals including a row address strobe (RAS) signal, a column address strobe (CAS) signal, and a write enable (WE) signal, each NAND gate also for receiving one of a plurality of bank selecting signals and an all bank selecting signal, the number of NAND gates being at least equal to the number of said bank memories;
   a plurality of delaying circuits for delaying the delivery of said control signals to said NAND gates; and
   a plurality of OR gates for receiving said bank selecting signals and said all bank selecting signal to selectively access said control signals into said bank memories, said bank selecting signals for selecting a single bank array and said all bank selecting signal for selecting more than one bank memory.

7. The memory device according to claim 6 wherein said delaying circuits only delay the RAS signal and the CAS signal to said bank memories.

8. The memory device according to claim 7 wherein the number of OR gates is at least equal to the number of said bank memories.

9. A memory device having a plurality of bank memories to which common address lines and common data lines are respectively connected, and a bank-selecting means having a plurality of first circuits, respectively comprised of a plurality of NAND gates whose input signals are the corresponding bank-selecting signal and control signal, connected to respective bank memories, each first circuit providing the corresponding bank memory with control signals needed for writing data into the corresponding bank memory or reading data from the same on receipt of a bank-selecting signal designating the same, said memory device comprising:
   a plurality of second circuits connected to said first circuit respectively for delivering a signal substantially equivalent to said bank-selecting signal to all of said first circuits so as to simultaneously deliver said control signals to all of said bank memories.

10. A memory device having a plurality of bank memories to which common address lines and common data lines are respectively connected, and a bank-selecting means having a plurality of first circuits connected to respective bank memories, each first circuit providing the corresponding bank memory with control signals needed for writing data into the corresponding bank memory or reading data from the same on receipt of a bank-selecting signal designating the same, said memory device comprising:
   a plurality of second circuits connected to said first circuit respectively for delivering a signal substantially equivalent to said bank-selecting signal to all of said first circuits so as to simultaneously deliver said control signals to all of said bank memories, said second circuits respectively comprised of a plurality of OR gates whose input signals are said bank-selecting signal and said equivalent signal to said bank-selecting signal.

11. A memory device having a plurality of bank memories to which common address lines and common data lines are respectively connected, and a bank-selecting means having a plurality of first circuits respectively connected to the bank memories, each first circuit comprising a gate whose input signals are a bank-selecting signal designating the corresponding bank memory and control signals needed for writing data into the corresponding bank memory or reading data from the same, said gate providing the corresponding bank memory with the control signals on receipt of the bank-selecting signal, said memory device comprising:
   a second circuit connected to said first circuits for simultaneously delivering a signal substantially equivalent to said bank-selecting signal to all of said first circuits so as to cause the first circuits to deliver said control signals to all of said bank memories, whereby common data is written into all of the bank memories through the common data lines.

12. The memory device according to claim 10, wherein said second circuit delivers the signal substantially equivalent to said bank-selecting signal when a specific data is provided to all of said bank memories through the common data lines, wherein writing said specific data erases contents of the bank memories.

13. A memory device having a plurality of bank memories to which common address lines and common data lines are respectively connected, and a bank-selecting means having a plurality of first circuits respectively connected to the bank memories, each first circuit comprising a gate whose input signals are a bank-selecting signal designating the corresponding bank memory and control signals needed for writing data into the corresponding bank memory or reading data from the same, said gate providing the corresponding bank memory with the control signals on receipt of the bank-selecting signal, said memory device comprising:
   a second circuit connected to said first circuits for simultaneously delivering a signal substantially equivalent to said bank-selecting signal to all of said first circuits so as to cause the first circuits to deliver said control signals to all of said bank memories, and one or more of said first circuits comprising a delay circuit which temporarily delays the delivery of said control signals to the corresponding bank memories so as to prevent the control signals from being supplied simultaneously to all of the bank memories.

14. A memory device having a plurality of bank memories to which common address lines and common data lines are respectively connected, the memory device comprising:

a plurality of gating means respectively connected to the bank memories, each gating means being provided with a bank-selecting signal designating the corresponding bank memory and control signals needed for writing data into the corresponding bank memory or reading data from the same, and providing the corresponding bank memory with the control signals on receipt of the bank-selecting signals;

selecting means for selecting providing one of the gating means with the bank-selecting signal;

all-bank-selecting means for providing all of said bank memories with the control signal on receipt of an all-bank-selecting signal, and means for providing all-bank-selecting means with the all-bank-selecting signal when a specific data is provided to all of the bank memories through the common data lines, wherein writing said specific data erases contents of the bank memories.

15. The memory device according to claim 14, wherein said gating means respectively comprise NAND gates.

16. The memory device according to claim 14 further comprising a delay means for temporarily delaying the delivery of said control signals to one or more bank memories to as to prevent the control signals from being supplied simultaneously to all of the bank memories.

* * * * *